United States Patent [19]

Ito

[11] 4,272,832
[45] Jun. 9, 1981

[54] SEMICONDUCTOR MEMORY DEVICE

[75] Inventor: Tsuneo Ito, Kodaira, Japan

[73] Assignee: Hitachi, Ltd., Tokyo, Japan

[21] Appl. No.: 41,553

[22] Filed: May 23, 1979

[30] Foreign Application Priority Data

May 24, 1978 [JP] Japan .................................. 53-61092

[51] Int. Cl.³ ............................................... G11C 7/00
[52] U.S. Cl. .................................... 365/189; 365/233
[58] Field of Search ........................ 365/189, 230, 233

[56] References Cited

U.S. PATENT DOCUMENTS

| 3,935,565 | 1/1976 | Moore | 365/233 |
| 3,962,686 | 6/1976 | Matsue et al. | 365/233 |

FOREIGN PATENT DOCUMENTS

| 1774524 | 11/1971 | Fed. Rep. of Germany . |
| 2340814 | 7/1975 | Fed. Rep. of Germany . |
| 2557006 | 7/1976 | Fed. Rep. of Germany . |
| 2508373 | 9/1976 | Fed. Rep. of Germany . |
| 2605184 | 12/1976 | Fed. Rep. of Germany . |

OTHER PUBLICATIONS

Hultman, Memery Clock Design, IBM Tech. Disc. Bul., vol. 9, No. 10, 3/67, pp. 1328-1329.

Primary Examiner—Stuart N. Hecker
Attorney, Agent, or Firm—Craig and Antonelli

[57] ABSTRACT

A semiconductor memory device comprises an input address buffer circuit and a memory cell circuit which are constructed of static logic circuits, an address decoder circuit which is constructed of a dynamic logic circuit, a detector circuit which detects a change in an input address signal, and a pulse generator circuit which is started operating by an output signal of the detector circuit and which provides a clock signal for the dynamic logic circuit. Owing to the detector circuit and the pulse generator circuit, the semiconductor memory device operates without the necessity for any external clock signal.

5 Claims, 10 Drawing Figures

SEMICONDUCTOR MEMORY DEVICE

BACKGROUND OF THE INVENTION

This invention relates to a semiconductor memory device which is constructed of MISFETs (insulated gate field-effect transistors).

MIS semiconductor memories hitherto known can be broadly classified into the dynamic memory and the static memory. The static memory is further divided into the type which requires external clocks (clocked static memory) and the type which does not require any external clock (non-clocked static memory).

The dynamic memory and the clocked static memory are of low power dissipation. However, they require external clock signals. Moreover, since the wait time attributed to the clock operation is needed, the cycle time which determines the operating frequency becomes greater than the access time, to bring about the problem that the memories are difficult of use.

On the other hand, with the non-clocked static memory, the cycle time and the access time become equal, and no external clock is necessary. Therefore, the whole system employing this memory is simple, and the memory is easy of use. The non-clocked static memory, however, has the problem that the power dissipation during the operation is high.

SUMMARY OF THE INVENTION

It is accordingly the principal object of this invention to provide a semiconductor memory device of low power dissipation which does not require any external clock signal.

Another object of this invention is to provide a novel semiconductor memory device which can bring the cycle time and the access time into agreement in the dynamic operation.

Further objects of this invention will become apparent from the following description and the accompanying drawings.

According to this invention, a semiconductor memory device is constructed of a static memory-cell array, an address decoder, an input circuit, an output circuit, etc. The address decoder, the input circuit, the output circuit, etc. are made logic circuits of the dynamic operation.

For the circuits of the dynamic operation, the change of an address input signal from a high level to a low level or the change thereof from the low level to the high level is detected by a detector circuit. On the basis of the detection signal of the detector circuit, the precharges of the dynamic logic circuits are started. The precharges are successively ended in correspondence with the transmission timings of the signal. Thus, the internal circuitry is dynamically operated, so that a low power dissipation is achieved. Simultaneously therewith, as an external characteristic, the agreement between the cycle time and the access time is achieved. A static memory which requires no external clock can be provided by detecting the change of the address input signal as described above.

BRIEF DESCRIPTION OF THE DRAWINGS

Hereunder this invention will be concretely described in connection with embodiments illustrated in the drawings, in which.

DETAILED DESCRIPTION OF THE PREFERRED EMBODIMENTS

Figure 1:
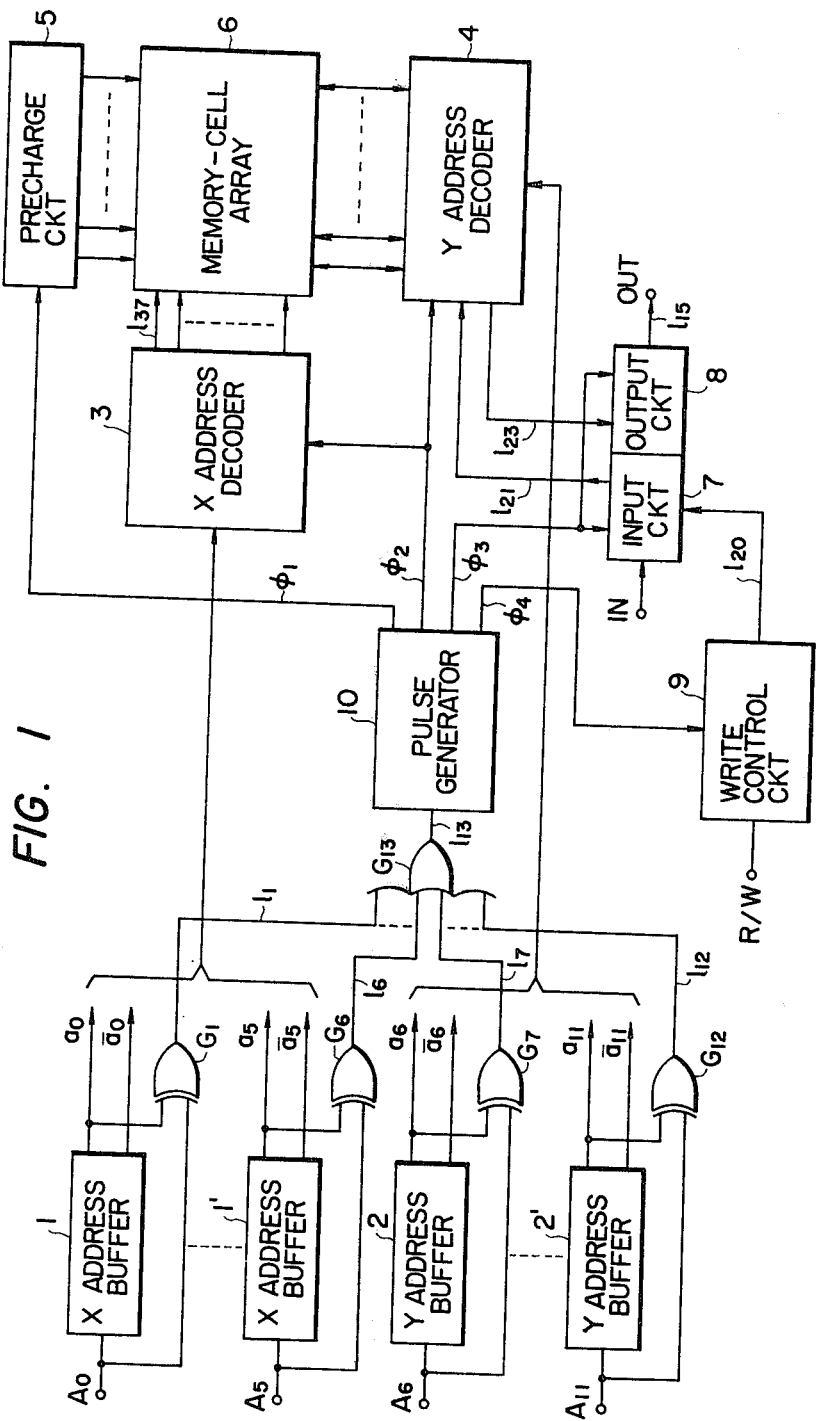
FIG. 1 is a block diagram of a semiconductor memory device embodying this invention.

Referring to FIG. 1, numerals 1-1' designate X address buffer circuits, and numerals 2-2' Y address buffer circuits.

These circuits are constructed of static logic circuits, and provide true and false address signals $a_o$, $\overline{a_o}$-$a_{11}$, $\overline{a_{11}}$ of MIS levels corresponding to respective address input signal $A_o$-$A_{11}$. By way of example, if the address input signal $A_o$ of the X address buffer circuit 1 is a high level signal of a TTL level, the true address signal $a_o$ and false address signal $\overline{a_o}$ to be provided are high level and low level of MIS levels respectively.

Numeral 3 designates an X address decoder circuit, which is constructed of a dynamic logic circuit receiving a clock signal $\phi_2$. The X address decoder circuit 3 receives the 6-bit address signals $a_o$, $\overline{a_o}$-$a_5$, $\overline{a_5}$ which are delivered from the X address buffer circuits 1-1'. Upon fall of the clock signal $\phi_2$, it forms a word line select signal for selecting one of $2^6$ or 64 word lines in a memory-cell array 6.

Numeral 4 indicates a Y address decoder circuit, which is constructed of a dynamic logic circuit receiving the clock signal $\phi_2$. The Y address decoder circuit 4 receives the 6-bit address signals $a_6$, $\overline{a_6}$-$a_{11}$, $\overline{a_{11}}$ which are delivered from the Y address buffer circuits 2-2'. Upon the fall of the clock signal $\phi_2$, it forms a digit line select signal for selecting one pair of $2^6$ pairs of digit lines in the memory-cell array 6. The Y address decoder circuit 4 couples the selected digit line among the plurality of digit lines of the memory-cell array 6 to a line $l_{21}$ under the control of a write control circuit 9. Also, it causes a line $l_{23}$ to trasfer a signal of the selected digit line.

Shown at 5 is a digit line load circuit. Concretely, it is made up of MISFETs which perform a precharge operation for the digit line by the use of a clock signal $\phi_1$.

The memory cell array 6 is composed of a plurality of static memory cells which are arranged in the shape of a matrix. Although the details are not shown in FIG. 1, each memory cell has a select terminal connected with the word line and input and output terminals connected with the digit lines. In the memory-cell array, the respective select terminals of a plurality of memory cells which are arranged in an identical row are connected to the corresponding word line in common, and the respective input and output terminals of a plurality of memory cells which are arranged in an identical column are connected to the corresponding digit lines.

Although not specifically restricted, the numbers of the word lines and the digit lines are respectively made 64 as described above, so that the number of the memory cells is 64 × 64 or 4,096.

Numeral 7 indicates an input circuit which receives a write input signal as an input and writes it into the memory cell. It is constructed of a dynamic logic circuit.

Numeral 8 indicates an output circuit which serves to deliver a read-out signal from the memory cell. It is constructed of a dynamic logic circuit.

The write control circuit 9 receives a read/write control signal R/W as an input. In case of a write operation, it controls the input circuit 7 so as to cause it to effect the write operation. It is constructed of a dynamic logic circuit.

Exclusive OR circuits $G_1$-$G_{12}$ receive as inputs the respective address input signals A to the address buffer circuits (1, 1'-2, 2') ad the inphase outputs a therefrom, and are respectively used for detecting variations in the address input signals $A_o$-$A_{11}$. More specifically, the output address signal a varies with a lag of an operating delay time of the address buffer circuit over the initiation of the variation of the input address signal A. At an output terminal of the exclusive OR circuit, therefore, a pulse signal which remains at "1" for the delay time is obtained. As a result, the variation of the address signal can be detected in dependence on the presence or absence of the pulse signal. A detection signal being a pulse signal which becomes the high level when any of the address input signals has changed is obtained at an output terminal of an OR circuit $G_{13}$ which receives the output signals of the respective exclusive OR circuits.

Shown at 10 is a precharge pulse generator circuit. It forms precharge pulses $\phi_1$-$\phi_4$ whose rises are stipulated by the detection output described above and whose falls are set in correspondence with the application timings of the input signals of the respective dynamic logic circuits.

The operation of the memory circuit in this embodiment will now be described with reference to an operating waveform diagram shown in FIG. 2.

Even if, for an access to the memory circuit, only one of the 12-bit address input signals $A_o$-$A_{11}$, for example, the address input signal $A_o$ changes from the high level to the low level, the output $a_o$ changes after the lapse of the operating delay time of the address buffer circuit 1. In consequence, the pulse signal which remains at the high level during the time is provided at the output terminal of the exclusive OR circuit $G_1$. The pulse signal of the exclusive OR circuit $G_1$ is applied to the pulse generator circuit 10 through the OR gate circuit $G_{13}$.

The pulse generator circuit 10 is a one-shot pulse generator circuit which is started by the rise of the pulse from the OR gate circuit $G_{13}$. It forms the pulse signals $\phi_1$-$\phi_4$ having predetermined pulse widths to be described later.

The pulse signals $\phi_1$-$\phi_4$ are employed as the precharging pulses of the respective dynamic logic circuits. In order to provide predetermined logic outputs, the various dynamic logic circuits need to complete the precharging operations after stipulating the respective input levels and to subsequently discharge the precharged charges in accordance with predetermined logic conditions.

Accordingly, the clock signals $\phi_1$-$\phi_4$ to be provided from the pulse generator circuit 10 have their respective timings set as explained below.

Among the various dynamic logic circuits, the address decoder circuits 3 and 4 need to xecute the logic output operations, in other words, the memory cell selecting operation before the input circuit 7 and the output circuit 8 in order to prevent the output circuit 8 from erroneously responding to the potential of the digit line previous to the selecting operation and also to avoid limiting the time of the write from the input circuit 7. Since the potential of the digit line in the memory-cell array is determined in correspondence with a stored information in the selected memory cell, the digit line load circuit 5 needs to complete the precharge operation before the memory cell selecting operation.

The write control circuit 9 is caused to operate after the input circuit 7 has operated.

Although not specifically restricted, the dynamic logic circuits are constructed so as to effect the precharge operations when the clock signals $\phi_1$-$\phi_4$ are at the high level and to effect the discharge operations in correspondence with the input signal when the clock signals $\phi_1$-$\phi_4$ have become the low level.

As illustrated at G in FIG. 2, accordingly, the clock signals $\phi_1$-$\phi_4$ are brought into the high level substantially simultaneously with the change of the address input signal and are subsequently brought into the low level in succession.

More specifically, the clock signal $\phi_1$ supplied to the digit line load circuit 5 is caused to fall firstly. Thus, the precharge into the digit lines of the memory-cell array is completed before the operations of the decoder circuits 3 and 4.

Subsequently, the clock signal $\phi_2$ is caused to fall, thereby causing the decoder circuits 3 and 4 to carry out the discharge operations corresponding to the input address signal. That is, the word line and the digit line as predetermined are selected by the decoder circuits, to assign the specified memory cell.

By subsequently causing the clock signal $\phi_3$ of the input and output circuits 7 and 8 to fall, these circuits are rendered operative. The read-out operation is started by the output circuit 8.

The precharge pulse $\phi_4$ of the write control circuit 9 is caused to fall after the completion of the operation of the input circuit. When the write control signal R/W indicates a write instruction level, the write into the memory cell is executed with the input signal. When the control signal R/W is at a read instruction level, the readout operation is continued.

In the sequence of the operations of the respective dynamic logic circuits as described above, the falls or pulse widths of the timing pulses $\phi_1$-$\phi_4$ are set.

As described above, according to the circuit of this embodiment, the internal circuits are reset (precharged) upon the change of the address input signal (upon the access to the memory) and they successively start operating in correspondence with the transmission timings of the signals, and the wait times necessary for the respective circuits are automatically included in the interval from the change of the address input to the output of data. Therefore, it is unnecessary to establish after the data output any wait time during which the operation is impossible, and the access time and the cycle time become equal when the memory is externally viewed. The memory can be used similarly to the non-clocked static memory in the prior art and does not require any external clock, so that the memory system is simplified and becomes easy of use.

Figure 3:
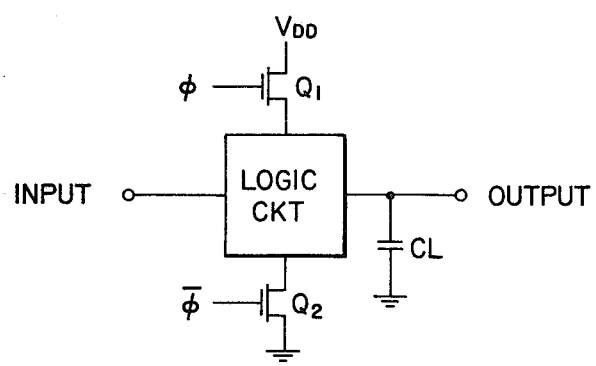
FIG. 3 is a circuit diagram of a dynamic logic circuit.

As shown in FIG. 3, the dynamic logic circuit is composed of a precharging MISFET $Q_1$, a logic block 11, and a discharging MISFET $Q_2$. Since only a charging current into a load capacitance $C_L$ in the precharging operation constitutes a conduction current, the power dissipation can be rendered low. Besides, since the logic output is stipulated by the discharging operation of the load capacitance $C_L$, the operating delay time can be shortened and hence the operating speed can be rendered high.

Figure 4:
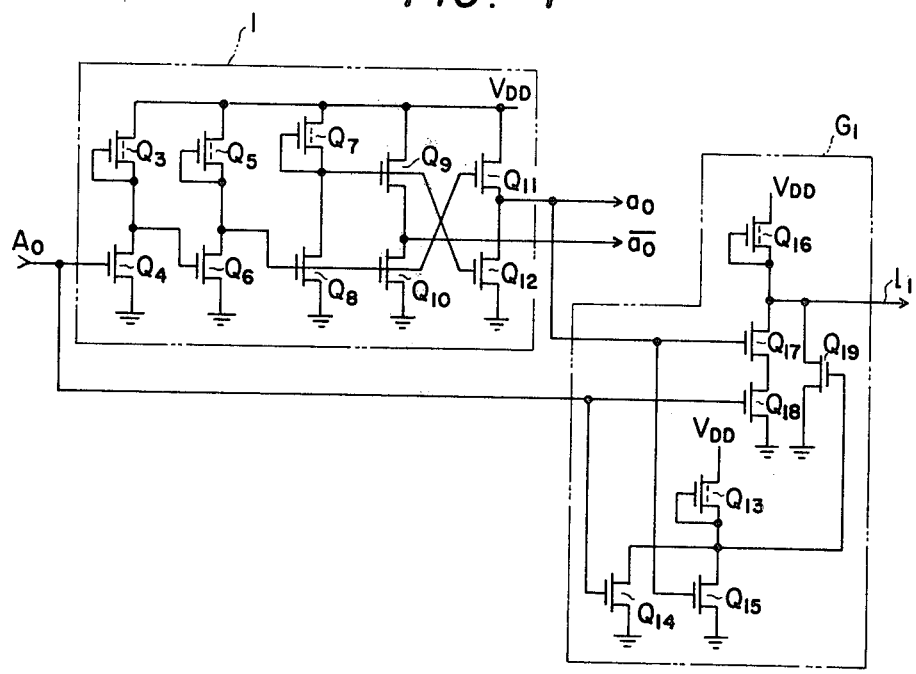
FIG. 4 is a circuit diagram of an address buffer circuit.

FIG. 4 shows a concrete circuit arrangement of the address buffer circuit 1 as well as the exclusive OR circuit $G_1$.

In the drawings referred to hereinbelow, MISFETs $Q_3$, $Q_5$, $Q_7$ etc. are indicated by a symbol different from that of MISFETs $Q_4$, $Q_6$, $Q_8$ etc., and they are depletion type MISFETs. The other MISFETs $Q_4$, $Q_6$, $Q_8$ etc. are of the enhancement type.

The address buffer circuit 1 is composed of MISFETs $Q_3$–$Q_{12}$. The depletion type MISFET $Q_3$ with its gate and source connected and the enchancement type MISFET $Q_4$ are connected in series between a power supply $V_{DD}$ and the earth point of the circuitry, to constitute a first inverter circuit. Likewise, a second inverter circuit is constructed of the MISFETs $Q_5$ and $Q_6$, and a third inverter circuit the MISFETs $Q_7$ and $Q_8$. A first push-pull circuit is constructed of the MISFETs $Q_9$ and $Q_{10}$, while a second push-pull circuit is constructed of the MISFETs $Q_{11}$ and $Q_{12}$.

The first to third inverter circuits and the first and second push-pull circuits are connected in cascade as shown in the figure.

Figure 2:
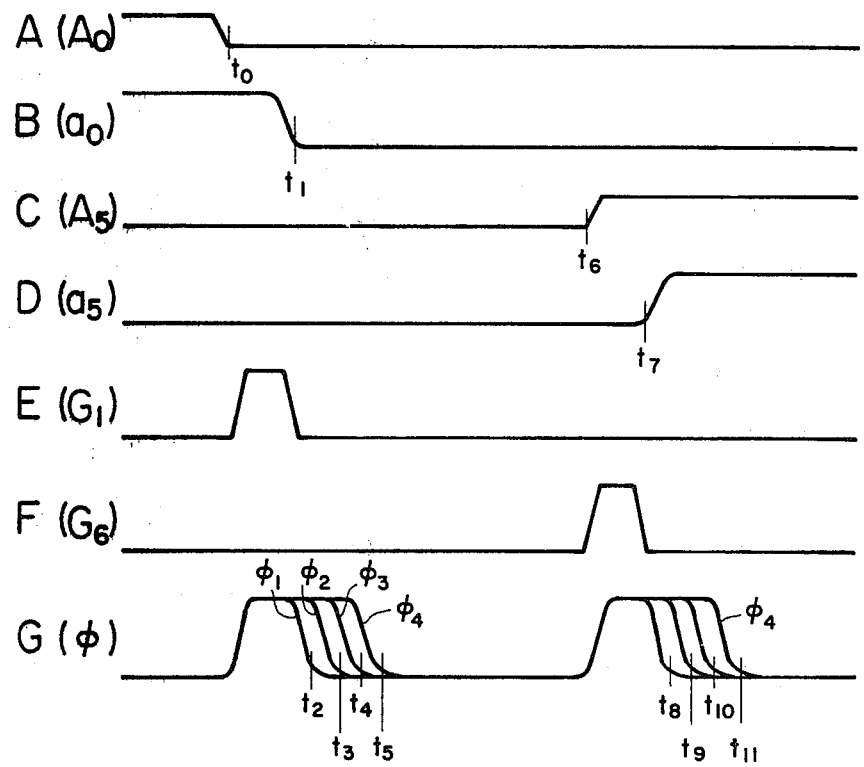
FIG. 2A-G is an operating waveform diagram of the semiconductor memory device shown in FIG. 1.

The address buffer circuit 1 receives the address input signal $A_o$ as shown at A in FIG. 2 at its input terminal or the gate electrode of the MISFET $Q_4$, thereby to deliver the address signal $a_o$ as shown at B in FIG. 2 to its true-value output terminal or the common juncture between the source electrode of the MISFET $Q_{11}$ and the drain electrode of the MISFET $Q_{12}$ after delay times of the inverter circuits and the push-pull circuits.

The exclusive OR circuit $G_1$ is composed of a NOR circuit made up of MISFETs $Q_{13}$–$Q_{15}$, and a NAND-NOR circuit made up of MISFETs $Q_{16}$–$Q_{19}$. As shown at E in FIG. 2, it delivers to a line $l_1$ a pulse signal which becomes the high level during the disagreement between the address input signal $A_o$ and true-value address signal $a_o$ of the address buffer circuit 1.

Figure 5:
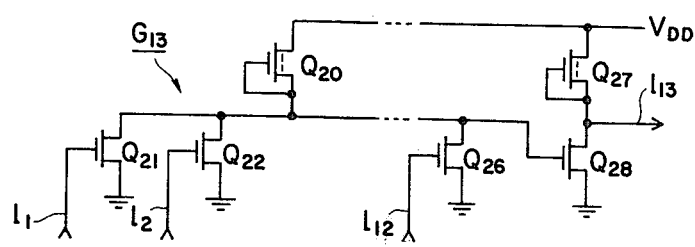
FIG. 5 shows the details of an OR gate circuit.

FIG. 5 shos a circuit arrangement of the OR gate circuit $G_{13}$. This circuit $G_{13}$ is composed of a NOR circuit made up of MISFETs $Q_{20}$–$Q_{26}$, and an inverter circuit made up of MISFETs $Q_{27}$ and $Q_{28}$. It delivers to a line $l_{13}$ the OR signal of the output signals of the exclusive OR circuits $G_1$–$G_{12}$ as applied to lines $l_1$–$l_{12}$.

Figure 6:
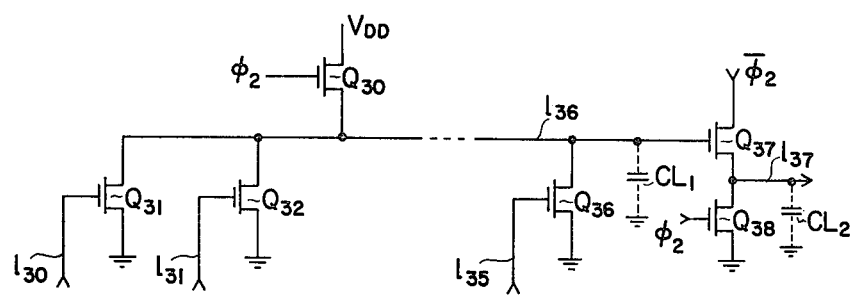
FIG. 6 shows the circuit diagram for an address decoder circuit.

FIG. 6 shows a circuit arrangement of the address decoder circuit for selecting one word line. As shown in the figure, the address decoder circuit is made up of MISFETs $Q_{30}$–$Q_{38}$.

The true and false address signals $a_o$, $\overline{a_o}$–$a_5$, $\overline{a_5}$ of the six X-address buffer circuits 1-1' are selected and applied to the respective gate electrodes of the six MISFETs $Q_{31}$–$Q_{36}$ through lines $l_{30}$–$l_{35}$. The clock signal $\phi_2$ is applied to the gate electrodes of the MISFETs $Q_{30}$ and $Q_{38}$, while the inverted signal $\overline{\phi_2}$ of the clock signal $\phi_2$ is applied to the drain electrode of the MISFET $Q_{37}$.

When the clock signal $\phi_2$ is made the high level by the pulse generator circuit 10, the MISFET $Q_{30}$ becomes the "on" state. At this time, if all the MISFETs $Q_{31}$–$Q_{36}$ are in the "off" state due to the address signals of the lines $l_{30}$–$l_{35}$, the capacitance $CL_1$ of a line $l_{36}$ is charged substantially to the high level of the supply voltage $V_{DD}$ through the MISFET $Q_{30}$. When the clock signal $\phi_2$ has become the low level, the MISFET $Q_{30}$ falls into the "off" state. At this time, the signal level of the line $l_{36}$ is held in the capacitance $CL_1$. By way of example, if all the address signals applied to the lines $l_{30}$–$l_{35}$ are of the low level so as to select the line $l_{36}$, the level of the line $l_{36}$ is held at the high level by the capacitance $CL_1$. If at least one of the lines $l_{30}$–$l_{35}$ is of the high level, charges in the capacitance $CL_1$ are discharged through the MISFET in the "on" state among the MISFETs $Q_{31}$–$Q_{36}$. As a result, the line $l_{36}$ becomes the low level.

The MISFET $Q_{38}$ is in the "on" state during the period during which the clock signal $\phi_2$ is at the high level. At this time, a capacitance $CL_2$ in a word line $l_{37}$ is precharged substantially to the earth potential by the MISFET $Q_{38}$ in the "on" state. The MISFET $Q_{37}$ is in the "on" state while the line $l_{36}$ is at the high level. Since, at this time, the inverted clock signal $\overline{\phi_2}$ is at the low level, current which flows through the MISFETs $Q_{37}$ and $Q_{38}$ in series becomes substantially zero.

Upon the fall of the clock signal $\phi_2$ to the low level, the MISFET $Q_{38}$ turns into the "off" state. At this time, the inverted clock signal $\overline{\phi_2}$ rises to the high level. If the line $l_{36}$ is selected, that is, it is of the high level, the MISFET $Q_{37}$ turns into the "on" state, with the result that the capacitance $CL_2$ of the word line $l_{37}$ is discharged substantially to the high level of the inverted clock signal $\overline{\phi_2}$. If the line $l_{36}$ is not selected, the MISFET $Q_{37}$ is in the "off" state, so that the capacitance $CL_2$ remains at the precharged low level.

The X-address decoder circuit 3 includes the unit decoder circuits as shown in FIG. 6 to the number of word lines.

Figure 7:
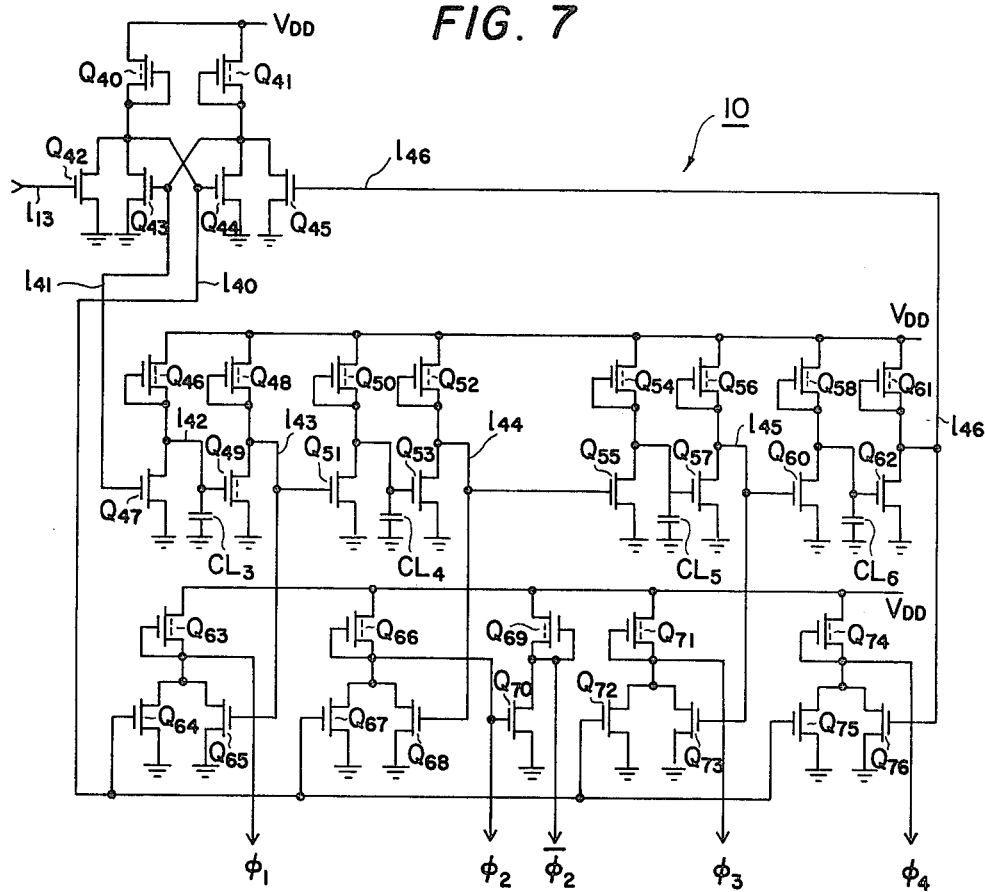
FIG. 7 is a circuit diagram of a pulse generator circuit.

FIG. 7 shows a circuit arrangement of the pulse generator circuit 10. This pulse generator circuit 10 is constructed of an R-S flip-flop circuit made up of MISFETs $Q_{40}$–$Q_{45}$, a plurality of delay circuits made up of MISFETs $Q_{46}$–$Q_{62}$, and a plurality of NOR circuits made up of MISFETs $Q_{63}$–$Q_{76}$.

The R-S flip-flop circuit delivers a high level signal to a line $l_{40}$ and a low level signal to a line $l_{41}$ in the reset state thereof.

Under this state, the first unit delay circuit which consits of the MISFETs $Q_{46}$–$Q_{49}$ and a capacitance $CL_3$ delivers a signal of low level to a line $l_{43}$ in response to the input signal of low level from the line $l_{41}$. The first NOR circuit which consists of the MISFETs $Q_{63}$–$Q_{65}$ delivers the clock signal $\phi_1$ of low level in response to the input signal of high level from the line $l_{40}$.

Likewise, the second delay circuit which consists of the MISFETs $Q_{50}$–$Q_{53}$ and a capacitance $CL_4$, the third delay circuit which consists of the MISFETs $Q_{54}$–$Q_{57}$ and a capacitance $CL_5$, and the fourth delay circuit which consists of the MISFETs $Q_{58}$–$Q_{62}$ and a capacitance $CL_6$ deliver low level signals to lines $l_{44}$, $l_{45}$, and $l_{46}$ respectively. Also the second NOR circuit which consists of the MISFETs $Q_{66}$–$Q_{68}$, the third NOR circuit which consists of the MISFETs $Q_{71}$–$Q_{73}$, and the fourth NOR circuit which consists of the MISFETs $Q_{74}$–$Q_{76}$ deliver the clock signals $\phi_2$, $\phi_3$, and $\phi_4$ of low level respectively. An inverter circuit which consists of the MISFETs $Q_{69}$ and $Q_{70}$ and which receives the clock signal $\phi_2$ delivers the inverted clock signal $\overline{\phi_2}$ of high level.

When, in response to the change of the address input signals $A_o$–$A_{11}$, the pulse signal of high level is applied from the OR gate circuit $G_{13}$ (refer to FIG. 1 or 5) to the line $l_{13}$, the R-S flip-flop circuit falls into the set state.

Since, owing to the set state, the signal of the line $l_{41}$ turns from the low level to the high level, the MISFET $Q_{47}$ of the first delay circuit as has been in the "off" state changes into the "on" state. The capacitance $CL_3$ which has been changed substantially to the supply voltage $V_{DD}$ through the MISFET $Q_{46}$ in advance begins to be discharged through the drain-source current path of the MISFET $Q_{47}$ now in the "on" state. After a predetermined time, the charged voltage of the capacitance $CL_3$ becomes lower than the input logic threshold voltage of an inverter circuit which consists of the MISFETs $Q_{48}$ and $Q_{49}$. That is, the first delay circuit delivers to the line $l_{43}$ the signal which turns from the low level to the high level with a predetermined delay time after the signal of the line $l_{41}$ has become the high level.

The first NOR circuit $Q_{63}$-$Q_{65}$ receives the low level signals at the pair of input lines $l_{40}$ and $l_{43}$ and accordingly provides the clock signal $\phi_1$ of high level during the delay time of the first delay circuit after the R-S flip-flop circuit has been set.

The second delay circuit delivers to a line $l_{44}$ a signal which becomes the high level with a predetermined delay time after the signal of the line $l_{43}$ has become the high level. The second NOR circuit $Q_{66}$-$Q_{68}$ provides the clock signal $\phi_2$ which is at the high level during the delay times of the first and second delay circuits.

The third and fourth delay circuits and the third and fourth OR gate circuits operate similarly and successively.

When the fourth delay circuit delivers a high level signal to a line $l_{46}$, the R-S flip-flop circuit is returned to the reset state.

Figure 8:
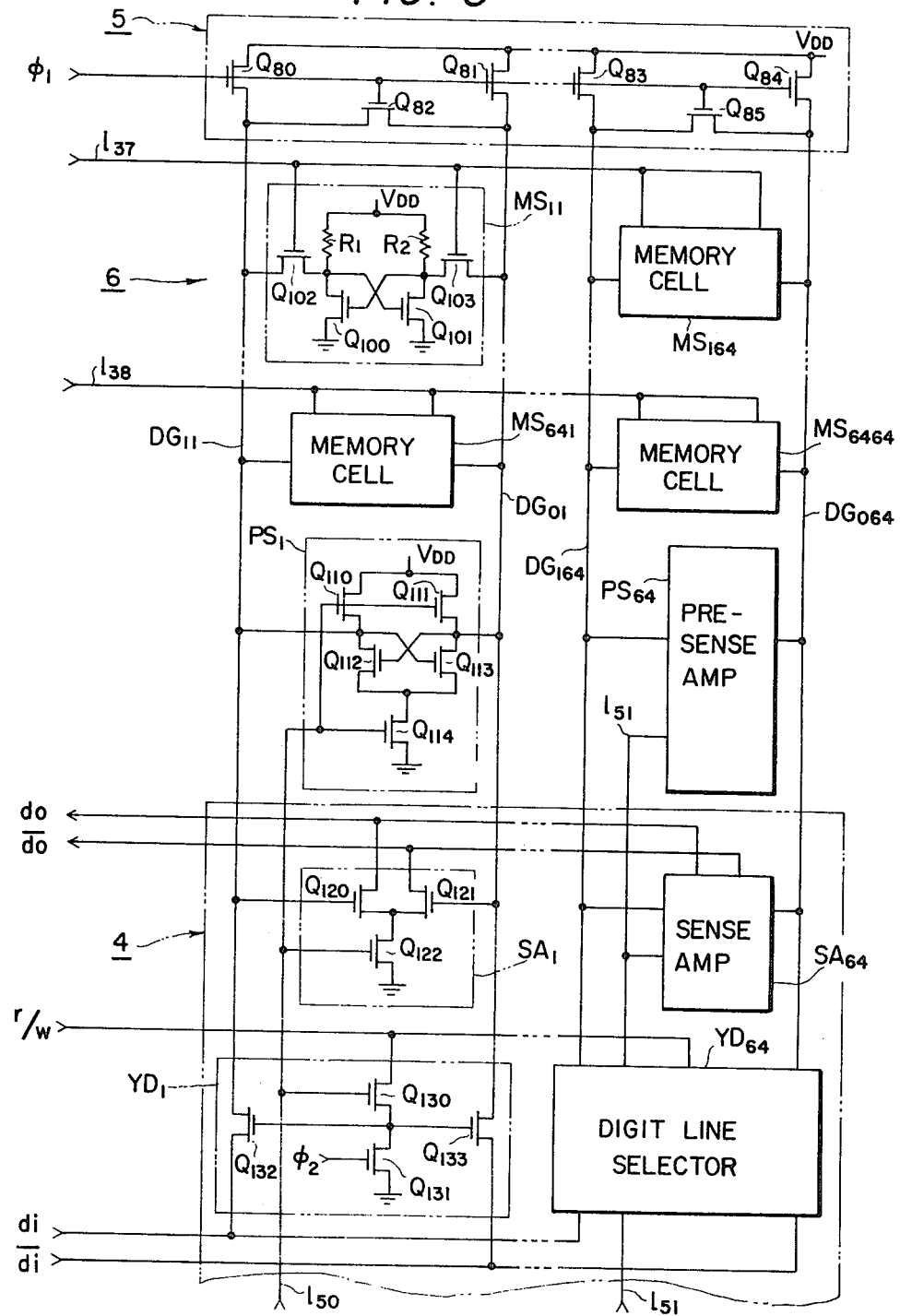
FIG. 8 shows the details of a digit line load circuit.

FIG. 8 shows circuit arrangements of the digit line load circuit 5, the memory-cell array 6 and the Y-address decoder circuit 4. In this figure, the Y-address decoder circuit has only a part thereof illustrated on account of limited space.

The memory-cell array includes a plurality of memory cells $MS_{11}$-$MS_{6464}$ which are arranged in the shape of a matrix.

As exemplified by the memory cell $MS_{11}$, the memory cell is constructed of transfer MISFETs $Q_{102}$ and $Q_{103}$, and a flip-flop circuit which is made up of MISFETs $Q_{100}$ and $Q_{101}$ and resistances $R_1$ and $R_2$ connected between the drains of the respective MISFETs $Q_{100}$ and $Q_{101}$ and a power supply terminal. The gate electrodes of the transfer MISFETs $Q_{102}$ and $Q_{103}$ are used as a select terminal, and terminals of the transfer MISFETs $Q_{102}$ and $Q_{103}$ as connected with digit lines are used as input and output terminals.

As apparent from the illustration, the select terminals of the memory cells arranged in an identical row, for example, the memory cells $MS_{11}$-$MS_{164}$ are connected to the common word line $l_{37}$, while the input and output terminals of the memory cells arranged in an identical column, for example, the memory cells $MS_{11}$-$MS_{641}$ are connected to a common pair of digit lines $DG_{11}$ and $DG_{01}$.

A digit line load circuit which consists of MISFETs $Q_{80}$-$Q_{82}$ and which receives the clock signal $\phi_1$ is connected to the pair of digit lines $DG_{11}$ and $DG_{01}$. Further connected to the pair of digit lines $DG_{11}$ and $DG_{01}$ are a pre-sense amplifier $PS_1$ consisting of MISFETs $Q_{110}$-$Q_{114}$, a sense amplifier $SA_1$ consisting of MISFETs $Q_{120}$-$Q_{122}$ and a digit line selector $YD_1$ consisting of MISFETs $Q_{130}$-$Q_{133}$, the operations of which are respectively controlled by a digit line select signal applied to a line $l_{50}$.

Likewise, a digit line load circuit $Q_{83}$-$Q_{85}$, a pre-sense amplifier $PS_{64}$, a sense amplifier $SA_{64}$ and a digit line selector $YD_{64}$ are connected to a pair of digit lines $DG_{164}$ and $DG_{064}$.

The drain electrodes of the MISFETs $Q_{120}$ and $Q_{121}$ in the sense amplifier $SA_1$ are used as output terminals. The corresponding output terminals of the sense amplifiers $SA_1$-$SA_{64}$ are connected to respective data lines $d_o$ and $\overline{d_o}$ in common as illustrated in the figure.

Figure 10:
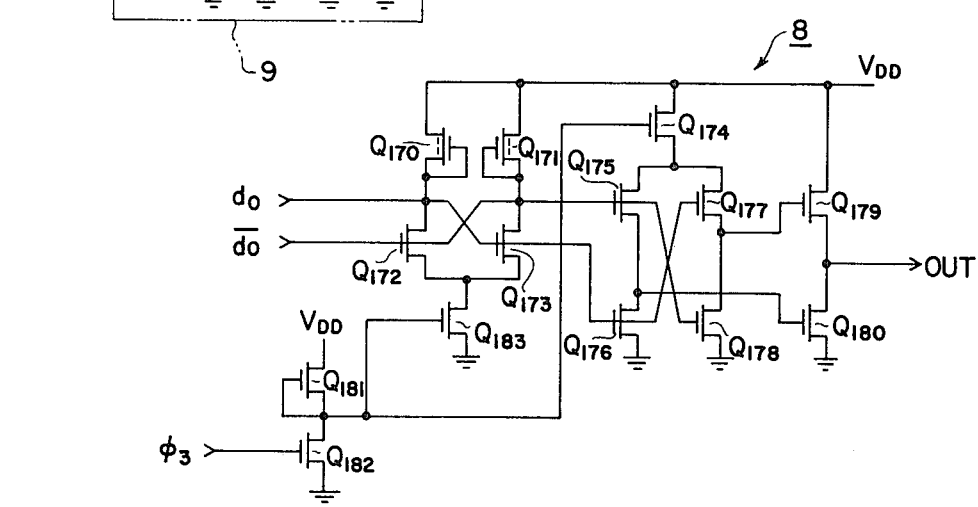
FIG. 10 is a circuit diagram of an output circuit.

The data output lines $d_o$ and $\overline{d_o}$ are connected to lines of the same symbols in the output circuit 8 shown in FIG. 10.

The source electrode of one of the MISFETs $Q_{132}$ and $Q_{133}$ in the digit line selector $YD_1$ is connected to a data input line $d_i$ or $\overline{d_i}$ along with the corresponding electrode in the digit line selector $YD_{64}$.

Figure 9:
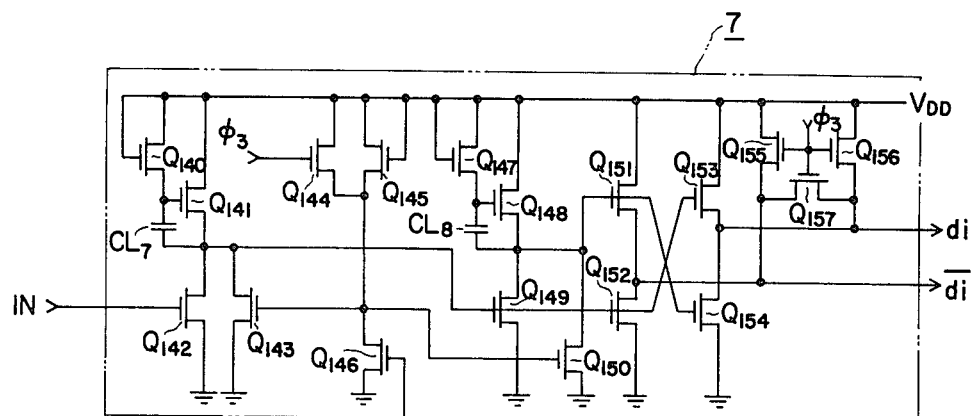
FIG. 9 shows the details of an input circuit and write control circuit.

The data input lines $d_i$ and $\overline{d_i}$ are connected to lines of the same symbols in the input circuit 7 shown in FIG. 9.

The outputs $a_6$, $\overline{a_6}$-$a_{11}$, $\overline{a_{11}}$ of the respective Y-address buffer circuits 2-2' in FIG. 1 are supplied to Y decoder circuits (not shown) each of which has substantially the same construction as that of the X decoder circuit shown in FIG. 6. Digit line select signals are applied to lines $l_{50}$-$l_{51}$ from the Y decoder circuits.

When the clock signal $\phi_1$ has become the high level in response to the change of the address input signals $A_0$-$A_1$ (refer to FIG. 1), the MISFETs $Q_{80}$-$Q_{82}$ and $Q_{83}$-$Q_{85}$ of the digit line load circuit 5 fall into the "on" state, and the capacitances (not shown) of the digit lines are precharged substantially to the supply voltage $V_{DD}$. In this case, the MISFET $Q_{82}$ acts to forcibly equalize the potentials of the digit lines $DG_{11}$ and $DG_{01}$. The MISFET $Q_{85}$ acts similarly to the MISFET $Q_{82}$.

The respective circuits in FIG. 8 operate as follows in case where, by way of example, the address input signals $A_0$-$A_{11}$ have assigned the memory cell $MS_{11}$.

Upon the fall of the clock signal $\phi_2$, the word line select signal on the word line $l_{37}$ and the digit line select signal on the line $l_{50}$ become the high level. The word line select signal and the digit line select signal on the other lines $l_{38}$ and $l_{51}$ remain at the low level.

Owing to the high level signal of the word line $l_{37}$, the transfer MISFETs $Q_{102}$ and $Q_{103}$ of the memory cell $MS_{11}$ turn into the "on" state. If, for example, the MISFET $Q_{100}$ is in the "on" state in correspondence with the stored content of the memory cell $MS_{11}$, the charges in the capacitance of the digit line $DG_{11}$ begin to be discharged through the MISFETs $Q_{102}$ and $Q_{100}$. As a result, the potentials of the digit lines $DG_{11}$ and $DG_{01}$ begin to get unbalanced in accordance with the stored content of the memory cell $MS_{11}$.

The pre-sense amplifier $PS_1$ starts operating owing to the digit line select signal of the line $l_{50}$, and amplifies the unbalance between the potentials of the digit lines $DG_{11}$ and $DG_{01}$.

The sense amplifier $SA_1$ starts operating owing to the same digit line select signal as described above. In case where the MISFET $Q_{100}$ of the memory cell $MS_{11}$ is in the "on" state as stated above, the digit line $DG_{11}$ becomes the low level and the digit line $DG_{01}$ the high level, and hence, the MISFET $Q_{120}$ of the sense amplifier $SA_1$ turns into the "off" state and the MISFET $Q_{121}$ into the "on" state. As a result, a current path is established between one data output line $\overline{d_o}$ and the earth point of the circuitry by the MISFETs $Q_{121}$ and $Q_{122}$ in the "on" state in the sense amplifier $SA_1$. The signals of the data lines $d_o$ and $\overline{d_o}$ are read out through the output circuit 8 to be explained later.

In the digit line selector $YD_1$, the MISFET $Q_{131}$ turns from the "on" state to the "off" state upon the fall of the clock signal $\phi_2$. The MISFET $Q_{130}$ turns into the "on" state upon condition that the digit line select signal of the line $l_{50}$ becomes the high level in synchronism with the fall of the clock signal $\phi_2$. During the period during which the clock signal $\phi_2$ is at the high level, the MISFETs $Q_{132}$ and $Q_{133}$ are in the "off" state because the potential of their gate electrodes is at the low level owing to the MISFET $Q_{131}$.

When the digit line select signal on the line $l_{50}$ has become the high level, the MISFETs $Q_{132}$ and $Q_{133}$ remain at the "off" state if a write control signal r/w is at the low level.

If the write control signal r/w is at the high level when the digit line select signal has become the high level, the MISFETs $Q_{132}$ and $Q_{133}$ turn into the "on" state because their gate electrodes are brought into the high level of the write control signal r/w through the MISFET $Q_{130}$. When the MISFETs $Q_{132}$ and $Q_{133}$ have turned into the "on" state as described above, the potentials of the digit lines $DG_{11}$ and $DG_{01}$ are forcibly determined into the potentials of the data input lines $d_i$ and $\overline{d_i}$. As a result, data is written into the memory cell $MS_{11}$ from the digit lines $DG_{11}$ and $DG_{01}$.

FIG. 9 shows circuit arrangements of the input circuit 7 and the write control circuit 9.

Although not specifically restricted, the write control circuit 9 is constructed, as shown in the figure, of a first NOR circuit which consists of MISFETs $Q_{158}$–$Q_{161}$ and a bootstrap capacitance $CL_9$, and a second NOR circuit which consists of MISFETs $Q_{162}$–$Q_{164}$. This circuit 9 receives the external write control signal R/W and the clock signal $\phi_4$ from the pulse generator circuit 10 (refer to FIG. 1 or 7). When the signal R/W is at the low level, that is, it is of the write instruction, the output signal r/w becomes the high level upon the fall of the clock signal $\phi_4$ from the high level to the low level. When the signal R/W is at the high level, the output signal r/w remains at the low level.

As shown in the figure, the input circuit 7 is constructed of an inverter circuit which consists of MISFETs $Q_{144}$–$Q_{146}$ and which receives the clock signal $\phi_3$ and the write control signal r/w, a first NOR circuit which consists of MISFETs $Q_{140}$–$Q_{143}$ and a bootstrap capacitance $CL_7$ and which receives the input data signal IN and the output of the inverter circuit, a second NOR circuit which consists of MISFETs $Q_{147}$–$Q_{150}$ and a bootstrap capacitance $CL_8$ and which receives the outputs of the first NOR circuit and the inverter circuit, a first push-pull circuit which consists of the MISFETs $Q_{151}$ and $Q_{152}$, a second push-pull circuit which consists of MISFETs $Q_{153}$ and $Q_{154}$, and a precharge circuit which consists of MISFETs $Q_{155}$–$Q_{157}$ and which receives the clock signal $\phi_3$.

The input circuit 7 delivers the signal of high level to the output lines $d_i$ and $\overline{d_i}$ irrespective of the input data signal during the precharge period, that is, during the period during which the clock signal $\phi_3$ is at the high level and the period during which the write control signal r/w is at the low level.

The input circuit 7 delivers a signal inphase with the input data signal IN to the output line $d_i$ and a signal of the opposite phase to the output line $\overline{d_i}$ upon condition that the clock signal $\phi_3$ becomes the low level and that the write control signal r/w becomes the high level in synchronism with the fall of the clock signal $\phi_4$.

FIG. 10 shows a circuit arrangement of the output circuit 8. An amplifier circuit is constructed of MISFETs $Q_{170}$–$Q_{173}$, a first push-pull circuit is constructed of MISFETs $Q_{175}$ and $Q_{176}$, a second push-pull circuit is constructed of MISFETs $Q_{177}$ and $Q_{178}$, and a third push-pull circuit is constructed of MISFETs $Q_{179}$ and $Q_{180}$. The amplifier $Q_{170}$–$Q_{173}$ has its operation controlled by a MISFET $Q_{183}$, and the first and second push-pull circuits have their operations controlled by a MISFET $Q_{174}$. In the amplifier circuit $Q_{170}$–$Q_{173}$, the depletion-mode load MISFETs $Q_{170}$ and $Q_{171}$ are also used as loads for the MISFETs $Q_{120}$ and $Q_{121}$ in each of the sense amplifiers $SA_1$–$SA_{64}$ in FIG. 8.

While the clock signal $\phi_3$ is at the high level, the output of an inverter circuit which consists of MISFETs $Q_{181}$ and $Q_{182}$ is at the low level. At this time, the MISFETs $Q_{183}$ and $Q_{174}$ are in the "off" state, so that the amplifier circuit and the first and second push-pull circuits are not in the operative state.

When the clock signal $\phi_3$ has fallen from the high level to the low level, the amplifier circuit begins to operate and amplifiers the difference of the levels of the data output lines $d_o$ and $\overline{d_o}$. Simultaneously, the first and second push-pull circuits begin to operate and deliver signals of opposite phases to each other in correspondence with the signals of the data lines $d_o$ and $\overline{d_o}$. As a result, an output signal OUT is provided from the third push-pull circuit.

This invention is not restricted to the foregoing embodiments. The sequence of the operations of the dynamic logic circuits can be variously altered in accordance with respective memory systems. Also the outputs of the pulse generator circuit 10 can be altered accordingly.

I claim:

1. A semiconductor memory device comprising an input address buffer circuit and a memory cell circuit which are constructed of static logic circuits, an address decoder circuit which is constructed of a dynamic logic circuit, a detector circuit which detects a change in an output signal of said address buffer circuit, and a pulse generator circuit which is started operating by an output signal of said detector circuit and which provides a clock signal for said address decoder circuit.

2. A semiconductor memory device according to claim 1, wherein said detector circuit is constructed so as to detect a delay time of an output signal of said input address buffer circuit relative to an input address signal thereof.

3. A semiconductor memory device according to claim 1, wherein said address decoder circuit is constructed so as to start a precharge operation upon a rise of said clock signal and to provide an output signal corresponding to an input signal upon a fall of said clock signal.

4. A semiconductor memory device as in claim 1, wherein said input address buffer circuit is unclocked.

5. A semiconductor memory device comprising an input address buffer circuit and a memory cell circuit which are constructed of static logic circuits, an address decoder circuit which is constructed of a dynamic logic circuit, a detector circuit which detects a change in an input address signal, and a pulse generator circuit which is started operating by an output signal of said detector circuit and which provides a clock signal for said dynamic logic circuit, wherein said pulse generator circuit comprises a flip-flop circuit and a signal delay circuit, and said flip-flop circuit is constructed so as to be set by said output signal of said detector circuit and to be reset by an output signal of said delay circuit.

* * * * *